United States Patent [19]

Yano et al.

[11] Patent Number: 5,179,041

[45] Date of Patent: Jan. 12, 1993

[54] METHOD FOR MANUFACTURING AN ELECTRODE STRUCTURE FOR III-V COMPOUND SEMICONDUCTOR ELEMENT

[75] Inventors: Takashi Yano; Naoyuki Yamabayashi, both of Osaka, Japan

[73] Assignee: Sumitomo Electric Industries, Ltd., Osaka, Japan

[21] Appl. No.: 777,627

[22] Filed: Oct. 16, 1991

Related U.S. Application Data

[62] Division of Ser. No. 535,480, Jun. 11, 1990, Pat. No. 5,077,599.

[30] Foreign Application Priority Data

Jun. 16, 1989 [JP] Japan .................. 1-155516

[51] Int. Cl.$^5$ .............................. H01L 21/44
[52] U.S. Cl. .................. 437/184; 437/188; 437/189; 437/190; 437/192; 437/202
[58] Field of Search ............ 437/184, 189, 190, 192, 437/202, 188

[56] References Cited

U.S. PATENT DOCUMENTS 4,301,233 11/1981 Calviello ........................ 437/228
4,853,346 8/1989 Baker et al. ..................... 437/184

FOREIGN PATENT DOCUMENTS 0054047 5/1981 Japan .................. 357/71
0013756 1/1982 Japan .................. 357/71
0090773 5/1983 Japan .................. 357/71
0005559 1/1985 Japan .................. 357/71
0242619 12/1985 Japan .
0002360 1/1986 Japan .................. 357/71
0060526 3/1988 Japan .
0252171 10/1988 Japan .

OTHER PUBLICATIONS

Shappirio, "Metal penetration and dopant redistribution beneath alloyed ohmic contacts to n-GaAs", J. Vac. Sci. Technol A, vol. 5, No. 4, Jul./Aug. 1987.

Primary Examiner—Brian E. Hearn
Assistant Examiner—Trung Dang
Attorney, Agent, or Firm—Beveridge, DeGrandi, Weilacher & Young

[57] ABSTRACT

A method is disclosed for forming an electrode on a III-V semiconductor element. The resulting electrode has high wire bonding strength, a low ohmic contact resistance, and high reliability, while still being easy to process into desired shapes. The electrode structure is formed by annealing the structure after the formation of a laminated structure having an ohmic layer including at least nickel formed on the III-V compound semiconductor, a bonding layer to be connected to a bonding wire, a stopper layer provided between the ohmic layer and the bonding layer, and an isolation layer provided between the stopper layer and the ohmic layer.

11 Claims, 7 Drawing Sheets

METHOD FOR MANUFACTURING AN ELECTRODE STRUCTURE FOR III-V COMPOUND SEMICONDUCTOR ELEMENT

This application is a divisional application of U.S. patent application Ser. No. 07/535,480, filed on Jun. 11, 1990, now U.S. Pat. No. 5,077,599, dated Dec. 31, 1991, which application is entirely incorporated herein by reference.

BACKGROUND OF THE INVENTION

1. Field of the Invention

The present invention relates to an electrode structure of an N-type III-V compound semiconductor element, and a method of manufacturing the same.

2. Related Background Art

A single element of Au, Ge or Ni, or an alloy thereof has been known as a low ohmic electrode material to be formed on the N-type III-V compound semiconductor. (Graham, and Steeds; Inst. Phys. Conf. Ser. No. 67: Section 10, p.507(1983), Kuan, Baston, Jackson, Rupprecht, and Wilkie; J.Appl. Phys. 54,6952 (1983)). In prior art electrodes which use those materials, a top surface of the electrode must be formed by an Au layer in order to allow press-contact of a bonding wire made of Au, and an annealing process is required to attain a low ohmic property.

However, during the annealing process, elements of the semiconductor, particularly a group III element diffuses to the top Au layer and separates on an electrode surface. As a result, the top Au layer is hardened and an oxide coating is formed. As a result, the wire bonding to the electrode is difficult to attain and the adhesion strength between the bonding wire and the electrode is materially lowered. In order to overcome the above problem, an intermediate layer (hereinafter referred to as a "stopper layer") for preventing the elements of the semiconductor from diffusing to the electrode surface is arranged between a semiconductor substrate and the top Au layer. By inserting the stopper layer, it is possible to suppress the diffusion of the elements of the semiconductor to the electrode surface while permitting the mutual diffusion at the vicinity of the interface of the electrode and the semiconductor.

An electrode structure which uses Mo has been known as the stopper layer for the low ohmic electrode structure of the N-type semiconductor element (JP-A-63-60526), but it has the following disadvantage. Usually, Mo is formed by thermal evaporation from a source heated by an electron beam, but because of a high melting point and a high thermal conductivity of this material, a temperature on a surface of a sample reaches above a heat resistance temperature (approximately 120° C.) of a photo-resist during the evaporation. Thus, it is difficult to process the electrode to desired shape by a lift-off method which uses the photo-resist. Where the electrode is processed by etching, portions to be left are covered by the photo-resist and unnecessary portions are etched off by etchant or etching gas. However, no material which does not etch the photo-resist but etches only Mo has been reported.

The inventors of the present invention have prepared a low ohmic electrode structure by using Ti as the stopper layer (see FIG. 1) but it has been found that the single Ti layer does not function as the stopper layer. Detail thereof will be discussed hereinlater.

SUMMARY OF THE INVENTION

It is an object of the present invention to provide an electrode structure which allows easy wire bonding, assures a high adhesion strength with a bonding wire and exhibits a low ohmic contact resistance.

It is another object of the present invention to provide a method of forming an electrode which allows easy manufacturing of an electrode having a low ohmic contact resistance.

In order to achieve the above objects, in an electrode structure formed by an annealing process of a laminated structure formed on a III-V compound semiconductor element, the laminated structure comprises an ohmic metal layer including at least Ni, formed on the semiconductor element, a bonding layer to which a bonding wire is to be connected, a stopper layer inserted between the ohmic metal layer and the bonding layer for suppressing the diffusion of elements of the semiconductor element and elements of the ohmic metal layer to an electrode surface, and an isolation layer inserted between the ohmic metal layer and the stopper layer for isolating the stopper layer from the ohmic metal layer.

Further, a method of forming an electrode structure on a III-V compound semiconductor element comprises;

a first step of forming a laminated structure comprising an ohmic metal layer including at least Ni on the semiconductor element, a bonding layer to which a bonding wire is to be connected, a stopper layer inserted between the ohmic metal layer and the bonding layer for suppressing the diffusion of elements of the semiconductor element to an electrode surface, and an isolation layer inserted between the ohmic metal layer and the stopper layer for isolating the stopper layer from the Ni; and a second step of annealing the laminated structure in a temperature range which assures the reservation of the bonding layer as it is.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The analysis by the inventors is first explained. The inventors of the present invention formed a laminated structure comprising an AuGeNi alloy layer formed on an InP substrate, a Ti layer formed thereon and an Au layer formed on the Ti layer, and heated the laminated structure to 380° C. The electrode surface changed in color and it was difficult to connect an Au wire to the electrode. The above temperature was measured by a thermo couple disposed closely to the substrate on which the laminated structure was formed. The substrate was in a quartz tube. The temperatures of measurement which appear hereinafter are measured by the same measurement method.

The inventors analyzed the above problem and found the followings.

Figure 1:
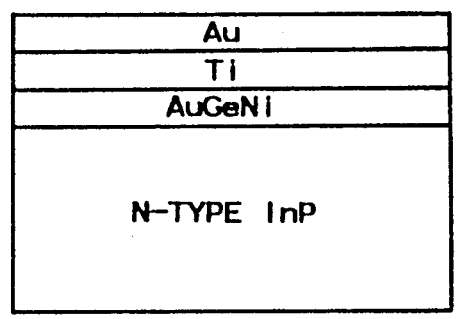
FIG. 1 is a sectional view of a laminated structure before annealing, for a prior electrode structure.
Figure 2:
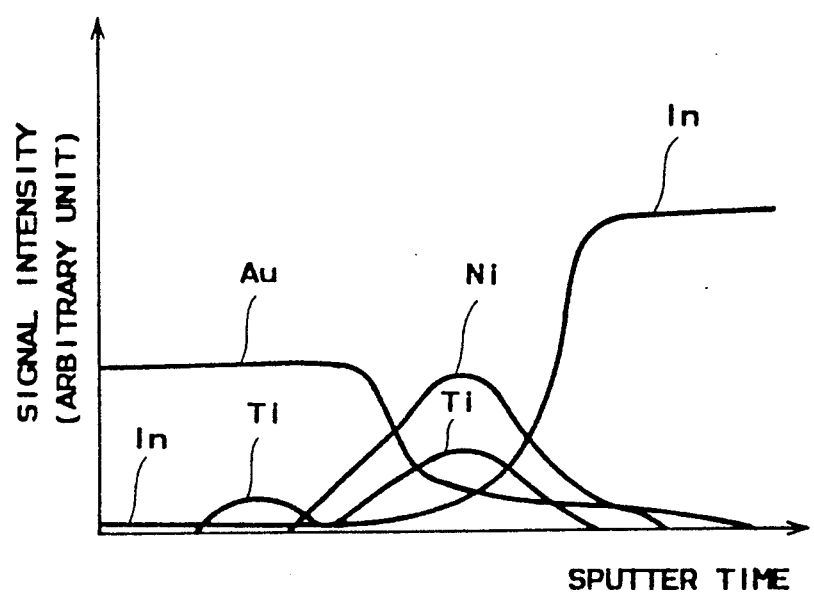
FIG. 2 is a graph showing a result of element analysis along a depth of the electrode structure after the annealing of the laminated structure of FIG. 1, measured by a micro Auger analysis method.

First, it has been found that the In which is the material that constitutes the substrate diffused to the Au layer on the top surface of the electrode. FIG. 2 shows a result of element analysis along a depth of the electrode structure after annealing of the laminated structure of FIG. 1, measured by an analysis method (micro-Auger analysis method) in which an element distribution from the electrode surface is measured by repeating a cycle of sputter etching by Ar ions and the element analysis by a micro orge spectroscopic analysis. It is seen from the analysis that In reaches to the electrode surface.

Figure 3:
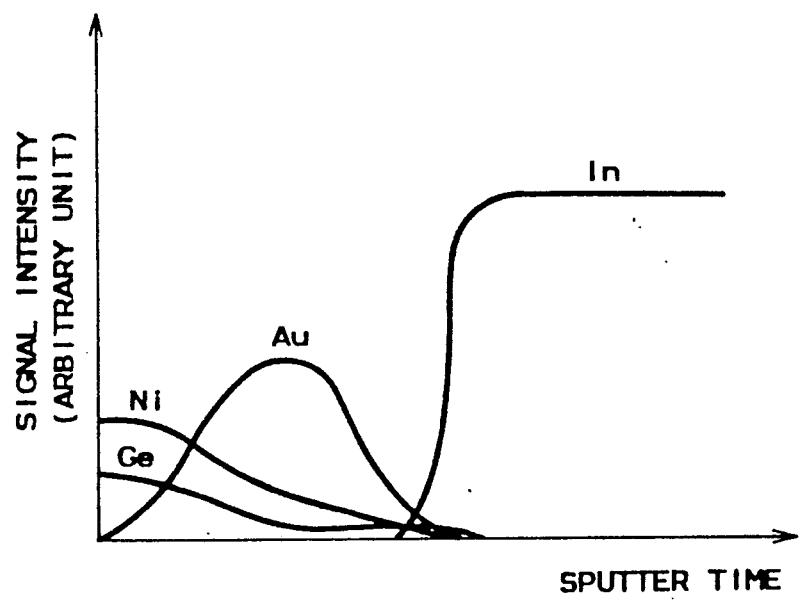
FIG. 3 is a graph showing a result of element analysis along a depth of an AuGeNi alloy layer formed by thermal evaporation from a source heated resistively, measured by the micro Auger analysis method immediately after the formation.

Secondly, it has been found that the AuGeNi alloy layer is not a single layer but it has been separated into AuGe, Au layers and a GeNi layer before annealing, in other words, the Ni at a much higher concentration than that which is to be in the AuGeNi alloy layer directly contacts to the Ti. FIG. 3 shows a result of element analysis along a depth of the AuGeNi alloy layer formed by the thermal evaporation from a resistively heated source, measured by the micro Auger analysis method immediately after the formation. It is seen from the analysis that the AuGeNi alloy layer is not a single layer since the formation of the laminated layer but it is separated into an alloy layer including Ge and Ni on the side of the electrode surface and an alloy layer including Au and Ge on the side of the substrate.

Figure 4:
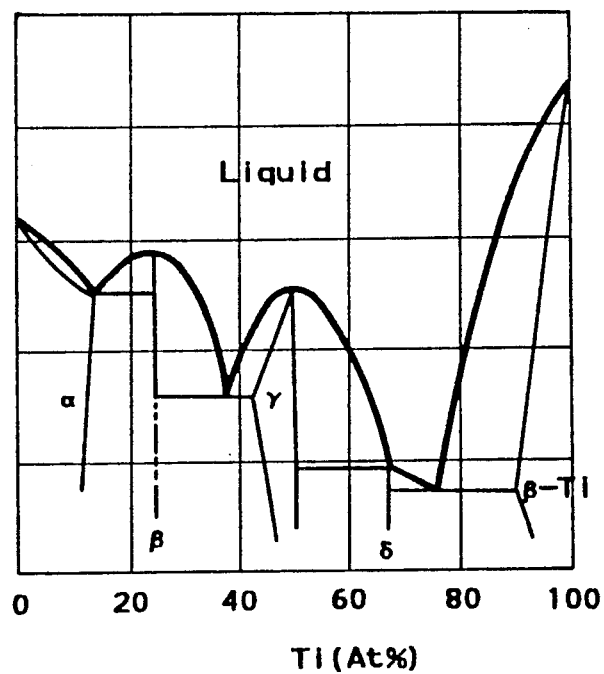
FIG. 4 shows a balanced status of Ni and Ti, quoted from Smithells Metals reference book (6th edition)

Thirdly, it has been found that Ni and Ti react during the annealing to produce an intermetallic compound. FIG. 4 shows a balanced status of Ni and Ti, quoted from the Smithells metals reference book (6th edition). It is seen from the balance chart that Ti and Ni are highly chemically active metals and they produce various intermetallic compounds. In FIG. 2, the peak values of Ti and Ni in profile substantially coincide and it is easy to imagine that some compound of Ti and Ni is produced.

From the above analysis, it is considered that the Ti layer is formed in direct contact with the very high concentration Ni, the Ni and the Ti readily react during the annealing, and as a result thereof, the Ti layer permits the penetration of Au and then In, and In finally reaches the Au layer on the top surface of the electrode.

An electrode structure (AuGe/Ni/Ti/Au) having a Ti layer inserted between and AuGe alloy layer and an Ni layer, and an Au layer has been known (JP-A-60-242619). It is said that in this electrode, most of Ti have a function to isolate the AuGe and Ni layers from the Au layers. However, according to an experiment done by the inventors of the present invention, it has been found that it cannot suppress the diffusion of at least In which is the constituting material of the substrate, and hence good wire bonding is not attained. It is considered that the reason therefor is that the annealing is done while Ni and Ti are adjacent to each other.

Figure 5:
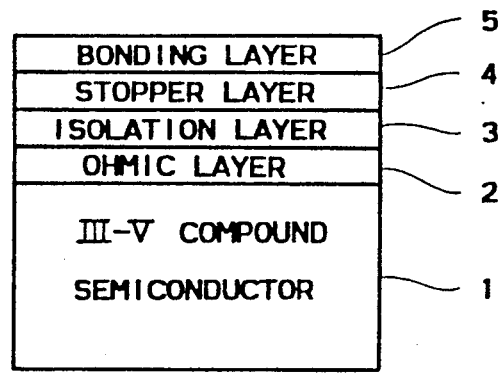
FIG. 5 shows a sectional view of a basic construction of a laminated structure before annealing, for an electrode structure of a III-V compound semiconductor element of the present invention.

FIG. 5 shows a basic construction of the laminated structure before annealing for the electrode structure of the III-V compound semiconductor element of the present invention. An ohmic metal layer 2 which includes Ni is formed on a III-V compound semiconductor substrate 1, and an isolation layer 3, a stopper layer 4 and a bonding layer 5 are sequentially laminated on the ohmic metal layer 2.

Since the ohmic metal layer includes at least Ni, the electrode structure is rendered low ohmic by the annealing. The stopper layer 3 serves to prevent the constituent elements of the semiconductor from diffusing to the electrode surface during the annealing. It includes a high melting point metal (for example, Mo, Ti, W). An isolation layer 3 is inserted between the ohmic metal layer 2 and the stopper layer 4 to isolate the Ni from the high melting point metal. By providing the isolation layer 3 between the ohmic metal layer 2 and the stopper layer 4, the reaction of the Ni and the high melting point metal during the annealing can be suppressed, and the diffusion of the constituent elements of the semiconductor element and the constituent elements of the ohmic metal layer to the electrode surface is prevented. The constituent element of the isolation layer 3 is preferably a material (for example Au) which does not produce an intermetallic compound with Ni.

The film thicknesses of the isolation layer 3 and the stopper layer 4 are determined by considering that (1) elements other than the constituent element (for example Au) of the isolation layer 3 do not diffuse to the bonding layer 5 through the stopper layer 5, and (2) the constituent elements of the bonding layer 5 do not diffuse to the semiconductor substrate.

The bonding layer 5 is formed on the stopper layer 4. The material of the bonding layer 5 is selected by considering the adhesion strength with the material used as the bonding wire. For example, when Au is used as the bonding wire, Au is selected as the material of the bonding layer 5.

A method of forming the electrode structure of the III-V compound semiconductor element of the present invention is now explained with reference to FIG. 5. The ohmic metal layer including at least Ni is formed on the III-V compound semiconductor element 1. For example, when the ohmic metal layer 2 is made of AuGeNi, the thermal evaporation from a resistively heated source may be used. Then, the isolation layer 3 is formed on the ohmic metal layer 2. For example, when the isolation layer 3 is made of Au, the thermal evaporation from a source heated by an electron beam may be used. The stopper layer 4 is further formed on the isolation layer 3. For example, when the stopper layer 4 is made of Ti, the thermal evaporation from a source heated by an electron beam may be used. Then, the bonding layer 5 is formed on the stopper layer 4. For example, when the bonding layer 5 is made of Au, the thermal evaporation from a source heated by an electron beam may be used. Through the above steps, the laminated structure shown in FIG. 5 is formed. Finally, it is processed to a desired shape and annealed in a temperature range of 300° to 450° C. to form the electrode structure.

Figure 6:
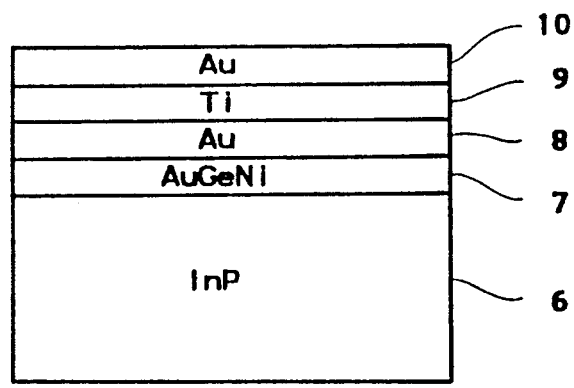
FIG. 6 shows a sectional view of a laminated structure before annealing, for an electrode structure of an InP substrate in one embodiment of the present invention.

An electrode structure of an N-type InP compound semiconductor element in one embodiment of the present invention is now explained. FIG. 6 shows a laminated structure before annealing for the electrode structure of the N-type InP semiconductor substrate. In the present embodiment, an N-type InP semiconductor substrate 6 is used as the III-V compound semiconductor element, an AuGeNi layer 7 is used as the ohmic metal layer, an Au layer 8 is used as the isolation layer, a Ti layer 9 is used as the stopper layer and an Au layer 10 is used as the bonding layer. The AuGeNi layer 7 is formed on the N-type InP semiconductor substrate 6, and the Au layer 8, the Ti layer 9 and the Au layer 10 are sequentially laminated thereon. The thickness of the AuGeNi layer 7 is selected in a range of 10 nm to 500 nm depending on a required characteristic such as a contact resistance and a sheet resistance. The low ohmic resistance between the N-type InP semiconductor substrate 6 and the electrode structure is assured by the AuGeNi layer 7. The film thicknesses of the Au layer 8 and the Ti layer 9 depend on the annealing temperature of the laminated structure and the thickness of the AuGeNi layer 7 and they are not necessarily independently determined. For example, when the thickness of the AuGeNi layer 7 is 100 nm and the annealing temperature is 300° to 400° C., it is preferable that the thickness of the Au layer 8 is 10 to 300 nm and the thickness of the Ti layer 9 is 30 to 300 nm. Because of the Au layer 8, the Ni which is present at a high concentration on the side of the surface of the AuGeNi layer 7 does not directly contact to the Ti layer 9, and the reaction of Ni and Ti is suppressed. The thickness of the Au layer 10 is selected in a range of 100 to 1000 nm, for example, by taking economical and technical reasons into account.

With this construction, the surface of the Au layer 10 is protected from the diffusion before and after the annealing and good wire bonding is attained. Since there is no excess Au in the semiconductor, the reliability of the semiconductor element is improved.

Figure 7:
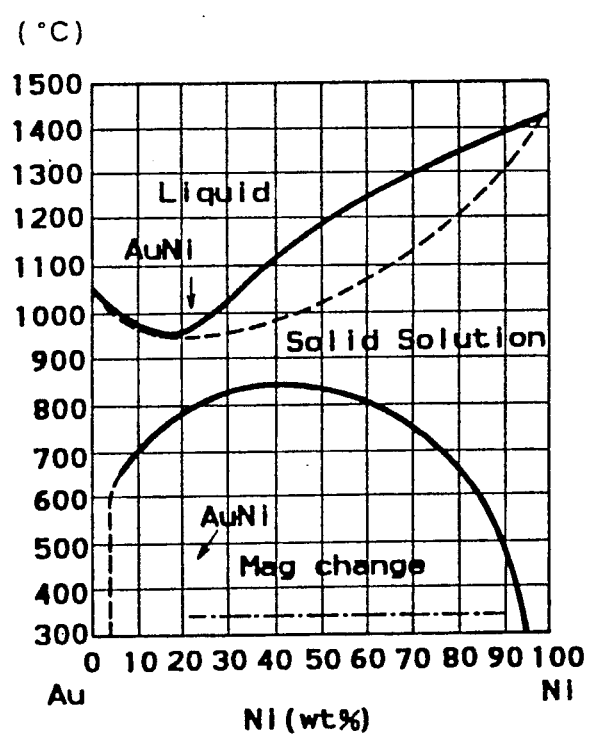
FIG. 7 shows a balanced status of Au and Ni quoted from the Smithells Metals reference book (6th edition)

FIG. 7 shows a balanced status of Au and Ni quoted from the Smithells Metals reference book (6th edition). It is apparent from the graph that Au and Ni do not produce an intermetallic compound and Au is a suitable material for the isolation layer. The modification of Ti can be prevented by effecting the annealing while providing the Au of an appropriate thickness between Ni and Ti. Further, Ti may effectively function as a diffusion barrier to Au and In which is the constituent element of the semiconductor. Several intermetallic compounds of Ti and Au have been known but Ti and Au do not substantially react during the short time annealing at a low temperature such as the annealing process in the formation of the electrode.

EXAMPLE 1

An electrode structure of Example 1 is now explained with reference to FIG. 6. An AuGeNi alloy layer 7 having a thickness of 110 nm, an Au layer 8 having a thickness of 200 nm, a Ti layer 9 having a thickness 100 nm and an Au layer having a thickness of 300 nm were formed on an InP substrate 6 in a vacuum environment to form a laminated structure. Annealing at 360° C. was effected to the laminated structure for five minutes, and then an Au wire having a diameter of 30 μm was press-contacted to the electrode surface.

In a tension test of the Au wire and the electrode, the Au wire was broken at a strength of 10 g or higher for all test samples. In those test samples, there was no peeling-off between the electrode and the Au wire. Thus, it has been confirmed that the electrode structure of the present Example exhibits a very high adhesion strength. An electrical characteristic of the element which employs the present electrode structure is of the same level as that of a conventional one and it has been confirmed that the low ohmic resistance requirement is fully met.

Figure 8A:
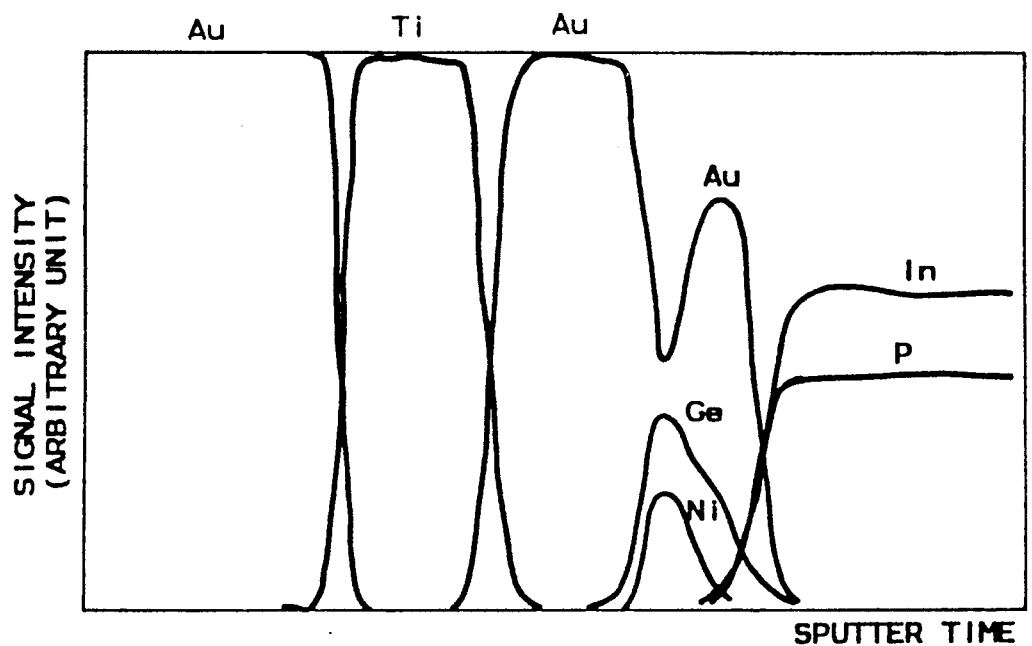
FIG. 8A is a graph showing a result of element analysis along a depth of an electrode structure before annealing, shown in Example 1, measured by the micro Auger analysis method.
Figure 8B:
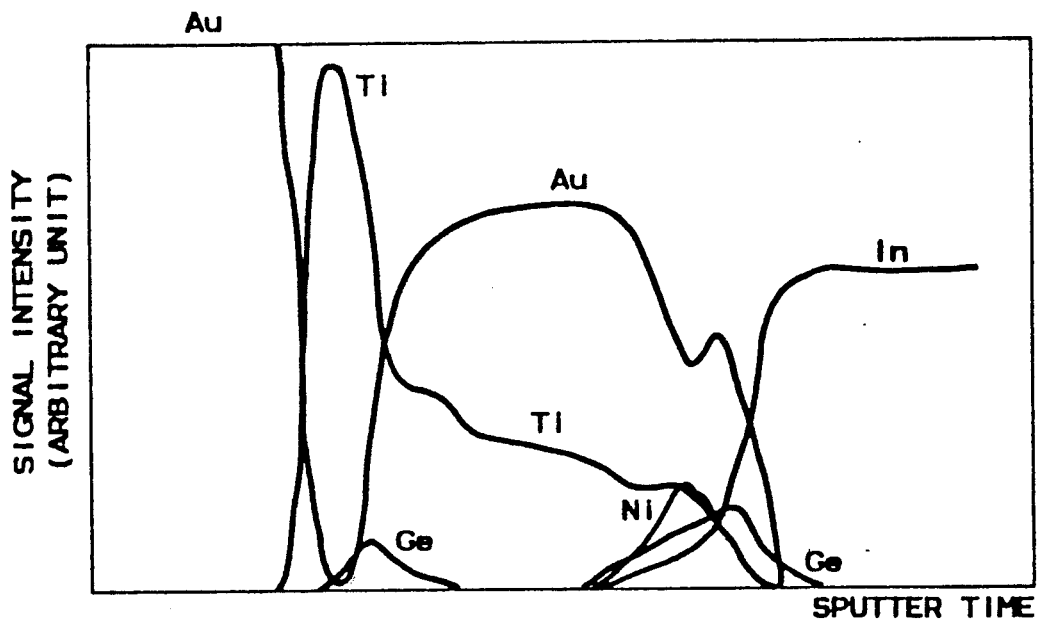
FIG. 8B is a graph showing a result of element analysis along a depth of the electrode structure after annealing, shown in Example 1, measured by the micro Auger analysis method.

FIGS. 8A and 8B show results of the micro Auger analysis before and after annealing of the electrode structure of the N-type InP compound semiconductor element of the present Example.

FIG. 8A shows a result of analysis of the laminated structure before the annealing. It is seen from the analysis that the laminated structure is a four-layer structure which have the Au layer (bonding layer), the Ti layer (stopper layer), the Au layer (isolation layer) and the AuGeNi layer (ohmic metal layer) laminated in sequence.

FIG. 8B shows a result of analysis of the electrode structure after the annealing. It is seen from the analysis that the electrode structure after the annealing is a three-layer structure having the Au layer (bonding layer), the Ti layer (stopper layer) and the ohmic alloy layer including the semiconductor material (In, P) of the substrate, the AuGeNi layer (ohmic metal layer), the Au layer (isolation layer) and the Ti layer (part of stopper layer), laminated in sequence. It is also seen that (1) the surface of the sample after the annealing consists of very high purity Au and the constituent material In of the substrate has not diffused, and (2) the peak portion of Ni does not substantially change before and after the annealing, and the stopper layer and the isolation layer function effectively.

EXAMPLE 2

Figure 9:
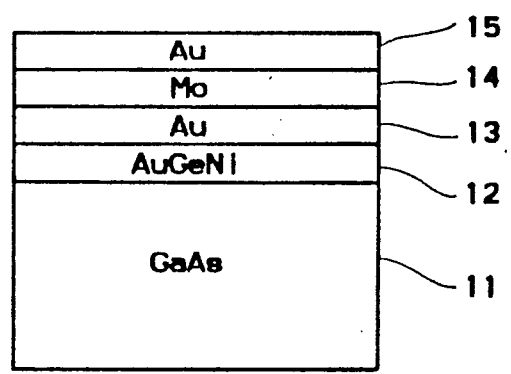
FIG. 9 shows a sectional view of a laminated structure before annealing for an electrode structure of a GaAs substrate in Example 2.

An electrode structure of Example 2 is now explained with reference to FIG. 9. In the present electrode structure, a GaAs substrate 11 is used as the III-V compound semiconductor element, an AuGeNi alloy layer 12 is used as the ohmic metal layer, an Au layer 13 is used as an isolation layer, an Mo layer 14 is used as a stopper layer and an Au layer 15 is used as the bonding layer. It is different from the electrode structure of the Example 1 in that the Mo layer having a thickness of 100 nm instead of the Ti layer is formed by the thermal evaporation from the source heated by the electron beam. Other conditions are same as those of the Example 1. With this structure, the annealing was effected at 500° C. which was higher than the annealing temperature in the Example 1, but the wire bond property did not change and exhibited good property. Since the annealing of GaAs is effected at a higher temperature than that for InP, the reaction between the elements and the mutual diffusion are more likely to occur. However, by the provision of the Mo layer (stopper layer) 14 and the Au layer (isolation layer) 13, the electrode structure which is effective for the high temperature annealing is attained.

EXAMPLE 3

Figure 10:
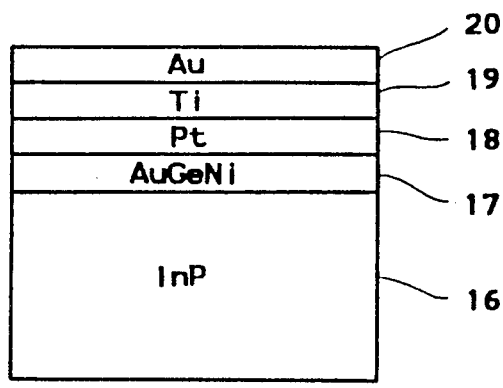
FIG. 10 shows a sectional view of a laminated structure before annealing for an electrode structure of an InP substrate in Example 3.

An electrode structure of Example 3 is now explained with reference to FIG. 10. In the present electrode structure, an InP substrate 16 is used as the III-V compound semiconductor element, an AuGeNi alloy layer 17 is used as the ohmic metal layer, a Pt layer 18 is used as the isolation layer, a Ti layer 19 is used as a stopper layer, and an Au layer 20 is used as the bonding layer. It is different from the electrode structure of the Example 1 in that the Pt layer having a thickness of 100 nm instead of the Au layer is formed by the thermal evaporation from the source heated by the electron beam. Other conditions are same as those in the Example 1. With this electrode structure, the same function and effect as those of the Au layer (isolation layer) of the Example 1 were confirmed. The Pt is located next to the Au in the element periodic law table and has a face-centered cubic structure as Au does. It is more chemically stable and the property is very similar to that of Au.

EXAMPLE 4

Figure 11:
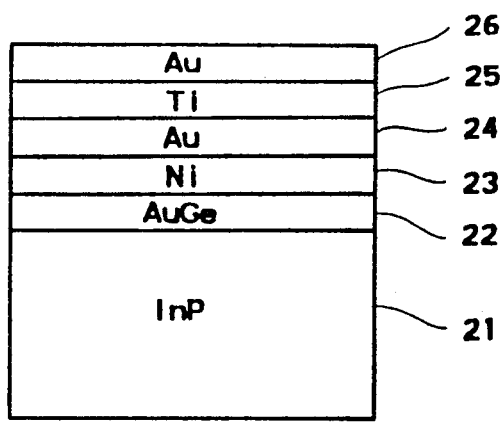
FIG. 11 shows a sectional view of a laminated structure before annealing for an electrode structure of an InP substrate in Example 4.

An electrode structure of Example 4 is now explained with reference to FIG. 11. In the present electrode structure, an InP substrate 21 is used as the III-V compound semiconductor element, an AuGe alloy layer 22 and an Ni layer 23 are used as the ohmic metal layer, an Au layer 24 is used as the isolation layer, a Ti layer 25 is used as the stopper layer, and an Au layer 26 is used as the bonding layer. It differs from the electrode structure of the Example 1 in that the AuGe alloy layer 22 having a thickness of 100 nm and the Ni layer 23 having a thickness of 50 nm are used instead of the AuGeNi layer as the ohmic metal layer. Other conditions are same as those in the Example 1. With this electrode structure, good wire bonding property is attained and the electrical characteristic of the semiconductor element which uses this electrode structure is good. Alternatively, the Ni layer 23 may be formed on the InP substrate 21 and the AuGe alloy layer 22 may be formed thereon.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A method of forming an electrode structure on an InP III-V compound semiconductor element, comprising:
   a first step of forming a laminated structure of an ohmic metal layer including at least an AuGeNi layer formed on said InP semiconductor element, said AuGeNi layer having a thickness of 110 nm, an Au bonding layer to be connected with a bonding wire, said Au bonding layer having a thickness of 300 nm, a Ti stopper layer inserted between said ohmic metal layer and said bonding layer for suppressing the diffusion of the constituent elements of said InP semiconductor element and the constituent element of said ohmic metal layer to an electrode surface, said Ti stopper layer having a thickness of 100 nm, and an Au isolation layer inserted between said ohmic metal layer and said stopper layer for isolating said Ni from said stopper layer, said Au isolation layer having a thickness of 200 nm, and
   a second step of annealing said laminated structure at a temperature of approximately 360° C. for 5 minutes in a nitrogen environment.

2. A method of forming an electrode structure on a GaAs III-V compound semiconductor element, comprising:
   a first step of forming a laminated structure of an ohmic metal layer including at least Ni formed on said GaAs semiconductor element, a bonding layer to be connected with a bonding wire, a Mo stopper layer inserted between said ohmic metal layer and said bonding layer for suppressing the diffusion of the constituent elements of said GaAs semiconductor element and the constituent element of said ohmic metal layer to an electrode surface, said Mo stopper layer having a thickness of 100 nm, formed by thermal evaporation from a source heated by an electron beam, and an isolation layer inserted between said ohmic metal layer and said stopper layer for isolating said Ni from said stopper layer, and
   a second step of annealing said laminated structure at a temperature of approximately 500° C.

3. A method of forming an electrode structure on a III-V compound semiconductor element, comprising:
   a first step of forming a laminated structure of an ohmic metal layer including at least Ni formed on said semiconductor element, a bonding layer to be connected with a bonding wire, a stopper layer inserted between said ohmic metal layer and said bonding layer for suppressing the diffusion of the constituent elements of said semiconductor element and the constituent element of said ohmic metal layer to an electrode surface, and a Pt isolation layer inserted between said ohmic metal layer and said stopper layer for isolating said Ni from said stopper layer, said Pt isolation layer having a thickness of 100 nm, formed by thermal evaporation from a source heated by an electron beam, and
   a second step of annealing said laminated structure in a temperature range which assures the reservation of said bonding layer as it is.

4. A method of forming an electrode structure on a III-V compound semiconductor element, comprising:
   a first step of forming a laminated structure of an ohmic metal layer on said semiconductor element, wherein said ohmic metal layer is a two layer structure including an AuGe alloy layer having a thickness of 100 nm and a Ni layer having a thickness of 50 nm formed on the AuGe alloy layer, a bonding layer to be connected with a bonding wire, a stopper layer inserted between said ohmic metal layer and said bonding layer for suppressing the diffusion of the constituent elements of said semiconductor element and the constituent element of said ohmic metal layer to an electrode surface, and an isolation layer inserted between said ohmic metal layer and said stopper layer for isolating said Ni from said stopper layer, and a second step of annealing said laminated structure in a temperature range which assures the reservation of said bonding layer as it is.

5. A method of forming an electrode structure on a III-V compound semiconductor element, comprising:

a first step of forming a laminated structure of an ohmic metal layer including at least Ni and Au formed on said semiconductor element, a bonding layer to be connected with a bonding wire, a stopper layer inserted between said ohmic metal layer and said bonding layer for suppressing the diffusion of the constituent elements of said semiconductor element and the constituent element of said ohmic metal layer to an electrode surface, and an isolation layer inserted between said ohmic metal layer and said stopper layer for isolating said Ni from said stopper layer, and a second step of annealing said laminated structure in a temperature range which assures the reservation of said bonding layer as it is.

6. The method according to claim 5, wherein the isolation layer includes Pt.

7. The method according to claim 5, wherein the isolation layer includes Pt and the stopper layer includes Mo.

8. The method according to claim 5, wherein the stopper layer includes Mo.

9. A method of forming an electrode structure on a III-V compound semiconductor element, comprising:

a first step of forming a laminated structure of an ohmic metal layer including at least Ni formed on said semiconductor element, a bonding layer to be connected with a bonding wire, a stopper layer inserted between said ohmic metal layer and said bonding layer for suppressing the diffusion of the constituent elements of said semiconductor element and the constituent element of said ohmic metal layer to an electrode surface, and a Pt containing isolation layer inserted between said ohmic metal layer and said stopper layer for isolating said Ni from said stopper layer, and a second step of annealing said laminated structure in a temperature range which assures the reservation of said bonding layer as it is.

10. A method of forming an electrode structure on a III-V compound semiconductor element, comprising:

a first step of forming a laminated structure of an ohmic metal layer including at least Ni formed on said semiconductor element, a bonding layer to be connected with a bonding wire, an Mo containing stopper layer inserted between said ohmic metal layer and said bonding layer for suppressing the diffusion of the constituent elements of said semiconductor element and the constituent element of said ohmic metal layer to an electrode surface, and an isolation layer inserted between said ohmic metal layer and said stopper layer for isolating said Ni from said stopper layer, and a second step of annealing said laminated structure in a temperature range which assures the reservation of said bonding layer as it is.

11. A method of forming an electrode structure on a III-V compound semiconductor element, comprising:

a first step of forming a laminated structure of an ohmic metal layer including at least Ni formed on said semiconductor element, a bonding layer to be connected with a bonding wire, an Mo containing stopper layer inserted between said ohmic metal layer and said bonding layer for suppressing the diffusion of the constituent elements of said semiconductor element and the constituent element of said ohmic metal layer to an electrode surface, and a Pt containing isolation layer inserted between said ohmic metal layer and said Mo stopper layer for isolating said Ni from said Mo stopper layer, and a second step of annealing said laminated structure in a temperature range which assures the reservation of said bonding layer as it is.

* * * * *